(12) United States Patent
Getreuer et al.

(10) Patent No.: US 11,017,864 B2
(45) Date of Patent: May 25, 2021

(54) PREEMPTIVE MITIGATION OF CROSS-TEMPERATURE EFFECTS IN A NON-VOLATILE MEMORY (NVM)

(71) Applicant: Seagate Technology LLC, Cupertino, CA (US)

(72) Inventors: Kurt Walter Getreuer, Colorado Springs, CO (US); Darshana H. Mehta, Shakopee, MN (US); Antoine Khoueir, Apple Valley, MN (US); Christopher Joseph Curl, Colorado Springs, CO (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/453,211

(22) Filed: Jun. 26, 2019

(65) Prior Publication Data

US 2020/0411110 A1    Dec. 31, 2020

(51) Int. Cl.

| | |
|---|---|
| *G06F 3/06* | (2006.01) |
| *G06F 12/02* | (2006.01) |
| *G11C 16/26* | (2006.01) |
| *G11C 16/04* | (2006.01) |
| *G11C 11/56* | (2006.01) |
| *G11C 16/10* | (2006.01) |

(Continued)

(52) U.S. Cl.
CPC ............ *G11C 16/26* (2013.01); *G06F 3/0604* (2013.01); *G06F 3/0659* (2013.01); *G06F 3/0679* (2013.01); *G06F 12/0253* (2013.01); *G11C 11/5621* (2013.01); *G11C 16/0483* (2013.01); *G11C 16/10* (2013.01); *G11C 16/3495* (2013.01); *G01K 1/14* (2013.01); *G01K 2217/00* (2013.01); *G06F 2212/1044* (2013.01); *G06F 2212/7205* (2013.01)

(58) Field of Classification Search
CPC ......................... G06F 3/0679; G06F 12/0246
See application file for complete search history.

(56) References Cited

U.S. PATENT DOCUMENTS

| | | |
|---|---|---|
| 6,559,538 B1 | 5/2003 | Pomerene et al. |
| 8,040,725 B2 | 10/2011 | Kang |
| 8,095,851 B2 | 1/2012 | Diggs et al. |

(Continued)

*Primary Examiner* — David E Martinez
(74) *Attorney, Agent, or Firm* — Hall Estill Attorneys at Law

(57) ABSTRACT

Method and apparatus for managing data in a non-volatile memory (NVM) of a storage device, such as a solid-state drive (SSD). An initial temperature is stored associated with the programming of data to memory cells in the NVM. A current temperature associated with the NVM is subsequently measured. At such time that a difference interval between the initial and current temperatures exceeds a selected threshold, a preemptive parametric adjustment operation is applied to the NVM. The operation may include a read voltage calibration, a read voltage increment adjustment, and/or a forced garbage collection operation. The operation results in a new set of read voltage set points for the data suitable for the current temperature, and is carried out independently of any pending read commands associated with the data. The initial temperature can be measured during the programming of the data, or measured during the most recent read voltage calibration operation.

21 Claims, 10 Drawing Sheets

(51) Int. Cl.
    *G11C 16/34*    (2006.01)
    *G01K 1/14*     (2021.01)

(56)              References Cited

U.S. PATENT DOCUMENTS

| | | | |
|---|---|---|---|
| 8,213,255 | B2 | 7/2012 | Hemink et al. |
| 8,344,475 | B2 | 1/2013 | Shaeffer et al. |
| 8,472,274 | B2 * | 6/2013 | Fai .................... G11C 11/5642 365/185.09 |
| 9,076,545 | B2 | 7/2015 | Mokhlesi |
| 9,183,000 | B2 | 11/2015 | Ichida et al. |
| 9,201,728 | B2 | 12/2015 | Patapoutian et al. |
| 9,275,741 | B1 | 3/2016 | Liang et al. |
| 9,286,933 | B2 | 3/2016 | Mathew et al. |
| 9,659,664 | B1 | 5/2017 | Griffin et al. |
| 9,668,337 | B2 | 5/2017 | Stoev et al. |
| 10,026,483 | B1 * | 7/2018 | Shah .................... G11C 29/021 |
| 2017/0117053 | A1 * | 4/2017 | Sharon ............... G11C 16/3418 |
| 2018/0046231 | A1 * | 2/2018 | Raghu ................... G06F 1/3225 |
| 2018/0293029 | A1 * | 10/2018 | Achtenberg ........... G11C 16/26 |
| 2019/0103164 | A1 * | 4/2019 | Malshe ................. G06F 11/076 |
| 2019/0267054 | A1 * | 8/2019 | Thalaimalaivanaraj ..................... G11C 29/42 |
| 2019/0347013 | A1 * | 11/2019 | Pletka ..................... G06F 3/064 |
| 2020/0026462 | A1 * | 1/2020 | Rayaprolu ............ G06F 3/0653 |
| 2020/0176063 | A1 * | 6/2020 | Malshe ................. G11C 16/04 |

* cited by examiner

PREEMPTIVE MITIGATION OF CROSS-TEMPERATURE EFFECTS IN A NON-VOLATILE MEMORY (NVM)

SUMMARY

Various embodiments of the present disclosure are generally directed to a method and apparatus for preemptively mitigating cross-temperature effects in a non-volatile memory (NVM), such as but not limited to a three-dimensional (3D) NAND flash memory device.

In some embodiments, a method includes steps of storing an initial temperature associated with the programming of data to a group of memory cells in a non-volatile memory (NVM); measuring a current temperature associated with the group of NVM cells; detecting a difference interval between the initial and current temperatures; and applying a preemptive parametric adjustment operation to the NVM responsive to the difference interval and independently of any pending read commands associated with the data, the preemptive parametric adjustment operation identifying a new set of read voltage set points for the data configured to read the data from the NVM during a subsequent read operation at the current temperature.

In other embodiments, a data storage device includes a non-volatile memory (NVM) having solid-state semiconductor memory cells, a programming circuit configured to write data to the memory cells during a programming operation, and a read circuit configured to read the data from the memory cells during a subsequent read operation. A cross-temperature monitor control (CTMC) circuit is configured to store an initial temperature of the NVM associated with the programming of the data, to subsequently measure a current temperature data of the NVM, to detect a difference interval between the initial and current temperatures, and to apply a preemptive parametric adjustment operation to the NVM responsive to the difference interval exceeding a selected threshold and independently of any pending read commands associated with the data. This preemptive parametric adjustment operation identifies a new set of read voltage set points for the data configured to read the data from the NVM during a subsequent read operation at the current temperature.

These and other features and advantages which characterize the various embodiments of the present disclosure can be understood in view of the following detailed discussion and the accompanying drawings.

DETAILED DESCRIPTION

Figure 1:
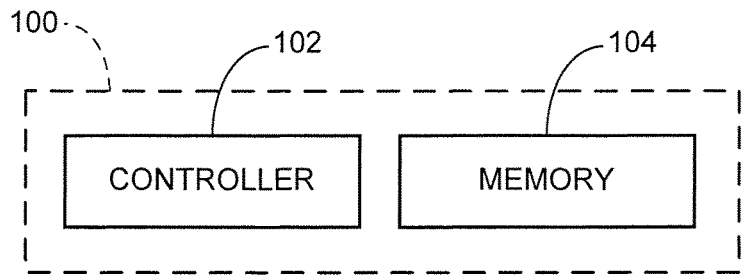
FIG. 1 provides a functional block representation of a data storage device constructed and operated in accordance with various embodiments of the present disclosure.

The present disclosure generally relates to systems and methods for storing data in a non-volatile memory (NVM).

Many current generation data storage devices such as solid state drives (SSDs) utilize NAND flash memory to provide non-volatile storage of data from a host device. Flash memory generally operates to store data in the form of accumulated electrical charge on a floating gate of each memory cell in the flash array. The programmed state can be sensed through the application of one or more read sense voltages to the cell.

These and other forms of erasable memories generally operate by being programmed to store data during a program (write) operation. Once programmed, the data may be read from the associated memory cells during subsequent read operations. The memory cells require an erasure operation to reset the memory cells before the cells can store replacement data. Each program/erase cycle is sometimes referred to as a PE cycle or PE count. A flash memory has a limited total number of PE counts that can be experienced during the operational life of the memory before the memory is worn out and no longer usable.

A limitation that has been observed with these and other forms of semiconductor based NVM is sometimes referred to as a cross-temperature effect. As used herein, the term "cross-temperature" relates to a differential (difference, delta) between the temperature of the memory at the time of the programming of a set of data, and the temperature of the memory at a subsequent time when the set of data are read out from the memory.

If the cross-temperature differential ("CTD") is low, the system tends to provide manageable and consistent numbers of bit errors during read operations. The bit errors may be measured as a bit error rate (BER), which can be stated as a ratio of the number of bit errors to the number of total bits read.

BER can increase significantly with larger cross-temperature differentials. Large CTD values can arise due to a variety of factors including ambient temperature changes, variations in power consumption and workload, and so on. CTD variations are among the leading causes of reliability and data transfer performance degradation in SSDs and other semiconductor based data storage devices.

Accordingly, various embodiments of the present disclosure are generally directed to preemptively mitigating the effects of large CTD values and variations thereof in a data storage device, such as but not limited to an SSD that uses 3D NAND flash memory.

As explained below, some embodiments provide a data storage device with a controller circuit and a non-volatile memory (NVM). The controller circuit is configured to write data to the NVM responsive to write commands and data supplied by a host device, and subsequently read and return the data from the NVM responsive to read commands from the host device.

The controller circuit is configured to record parametric data such as temperature at the time of the programming of various sets of data to various locations in the NVM. Other parametric data may be collected at this time such as a time/date code of when the various data sets were written, etc.

The controller circuit proceeds to measure temperature associated with the NVM over time. These temperature measurements enable the controller circuit to generate estimates of a cross-temperature differential ("CTD") for various data sets at different locations throughout the NVM. It will be appreciated that different data sets may have different CTD values for the same current temperature value depending on the different temperatures that were present when the different data sets were programmed.

For those data sets that exhibit excessive CTD values, a preemptive parametric adjustment operation takes place by the controller circuit. The parametric adjustment operation is carried out in the background and can take a variety of forms.

In some cases, the controller circuit initiates a preemptive read voltage calibration routine to generate new read voltage set points which are then stored for use during subsequent read commands. In other cases, the controller circuit performs a preemptive read voltage adjustment routine that identifies the then-existing read voltage set points and adds one or more increments to derive new read voltage set points, which are then stored for future use. In yet other cases, the controller circuit performs a forced data relocation (garbage collection) to relocate the data sets to a new location and reset (erase) the existing location for use in storing new data.

In each of these approaches, the NVM is periodically monitored and adjusted to provide enhanced BER performance. The evaluation of CTD is carried out independently of the receipt and processing of host level read and write commands. In this way, at any given time, the NVM is parametrically adjusted and ready to provide improved read performance if and when read commands are received.). This is true even if read voltage set point adjustments are made for a set of data that is thereafter not ever actually read from the memory.

This is a significant improvement over the existing art which tends to take a reactive approach and only address CTD once a read command is serviced and excessive read errors are discovered. Thus, improved first read BER and enhanced data throughput rates are achieved, while maintaining reasonable rates at which data sets are relocated within the memory.

It will be recognized that recently programmed data sets may tend to have relatively lower CTD values on the basis that, while the temperature of a semiconductor memory can vary widely over time, the rate of temperature change occurs relatively slowly with respect to time. It follows that data sets that have persisted longer in memory may tend to exhibit greater variability among the estimated CTD values as compared to data sets that have been more recently programmed. Thus, in some cases the controller circuit can operate to prioritize the data sets based on aging and focus on estimating CTD values for older data sets first.

Different thresholds may be applied to the determined CTD values, with different parametric adjustment routines being applied based on the magnitude of the CTD values in relation to these different thresholds, as well as in relation to other parametric factors. The skilled artisan will recognize from the present disclosure that adjustments to account for cross-temperature effects can be implemented at the word line (WL)/page level granularity as required.

These and other features and advantages of various embodiments can be understood beginning with a review of FIG. 1 which provides a functional block diagram of an exemplary data storage device 100. The device 100 is characterized as a solid-state drive (SSD) that employs non-volatile semiconductor memory such as 3D NAND flash memory, although the present disclosure is not so limited.

The device 100 includes a controller circuit 102 which provides top-level control and communication functions as the device interacts with a host device (not shown) to store and retrieve host user data. A memory module 104 provides non-volatile storage of the data in the form of an array of flash memory cells.

The controller 102 may be a programmable CPU processor that operates in conjunction with programming stored in a computer memory within the device. The controller may alternatively be a hardware controller. The controller may be a separate circuit or the controller functionality may be incorporated directly into the memory array 104.

As used herein, the term controller and the like will be broadly understood as an integrated circuit (IC) device or a group of interconnected IC devices that utilize a number of fundamental circuit elements such as but not limited to transistors, diodes, capacitors, resistors, inductors, waveguides, circuit paths, planes, printed circuit boards, memory elements, etc. to provide a functional circuit regardless whether the circuit is programmable or not. The controller may be arranged as a system on chip (SOC) IC device, a programmable processor, a state machine, a hardware circuit, a portion of a read channel in a memory module, etc.

Figure 2:
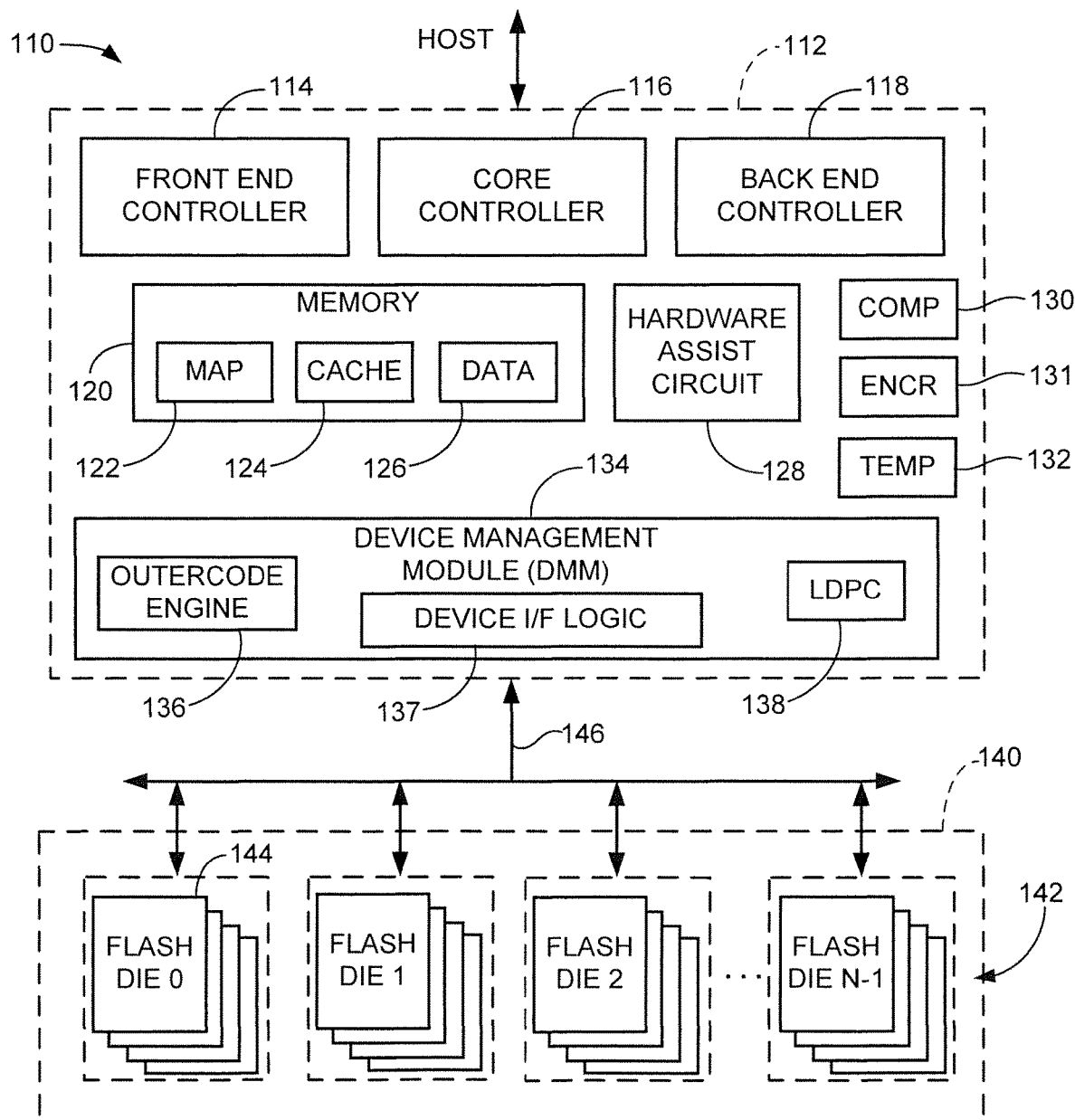
FIG. 2 illustrates the data storage device of FIG. 1 characterized as a solid state drive (SSD) that uses NAND flash memory in accordance with some embodiments.

In order to provide a detailed explanation of various embodiments, FIGS. 2 through 6 have been provided to describe relevant aspects of an exemplary data storage device 110 corresponding to the device 100 of FIG. 1. The device 110 is shown in FIG. 2 to be configured as a solid state drive (SSD) that communicates with one or more host devices via one or more Peripheral Component Interface Express (PCIe) ports. The NVM is contemplated as comprising NAND flash memory, although other forms of solid state non-volatile memory can be used.

In at least some embodiments, the SSD operates in accordance with the NVMe (Non-Volatile Memory Express) Standard, which enables different users to allocate NVM sets (die sets) for use in the storage of data. Each die set may form a portion of an NVMe Namespace that may span multiple SSDs or be contained within a single SSD. Each NVMe Namespace will be owned and controlled by a different user (owner). While aspects of various embodiments are particularly applicable to devices operated in accordance with the NVMe Standard, such is not necessarily required.

The SSD 110 includes a controller circuit 112 with a front end controller 114, a core controller 116 and a back end controller 118. The front end controller 114 performs host I/F functions, the back end controller 118 directs data transfers with the memory module 114 and the core controller 116 provides top level control for the device.

Each controller 114, 116 and 118 includes a separate programmable processor with associated programming (e.g., firmware, FW) in a suitable memory location, as well as various hardware elements to execute data management and transfer functions. This is merely illustrative of one embodiment; in other embodiments, a single programmable processor (or less/more than three programmable processors) can be configured to carry out each of the front end, core and back end processes using associated FW in a suitable memory location. A pure hardware based controller configuration can alternatively be used. The various controllers may be integrated into a single system on chip (SOC) integrated circuit device, or may be distributed among various discrete devices as required.

A controller memory 120 represents various forms of volatile and/or non-volatile memory (e.g., SRAM, DDR DRAM, flash, etc.) utilized as local memory by the controller 112. Various data structures and data sets may be stored by the memory including one or more map structures 122, one or more caches 124 for map data and other control information, and one or more data buffers 126 for the temporary storage of host (user) data during data transfers.

A non-processor based hardware assist circuit 128 may enable the offloading of certain memory management tasks by one or more of the controllers as required. The hardware circuit 128 does not utilize a programmable processor, but instead uses various forms of hardwired logic circuitry such as application specific integrated circuits (ASICs), gate logic circuits, field programmable gate arrays (FPGAs), etc.

Additional functional blocks can be realized in or adjacent the controller 112, such as a data compression block 130, an encryption block 131 and a temperature sensor block 132. The data compression block 130 applies lossless data compression to input data sets during write operations, and subsequently provides data de-compression during read operations. The encryption block 131 applies cryptographic functions including encryption, hashes, decompression, etc. The temperature sensor 132 senses temperature of the SSD at one or more locations.

A device management module (DMM) 134 supports back end processing operations and may include an outer code engine circuit 136 to generate outer code, a device I/F logic circuit 137 and a low density parity check (LDPC) circuit 138 configured to generate LDPC codes as part of the error detection and correction strategy used to protect the data stored by the SSD 110.

A memory module 140 corresponds to the memory 104 in FIG. 1 and includes a non-volatile memory (NVM) in the form of a flash memory 142 distributed across a plural number N of flash memory dies 144. Flash memory control electronics (not separately shown in FIG. 2) may be provisioned on each die 144 to facilitate parallel data transfer operations via a number of channels (lanes) 146.

Figure 3:
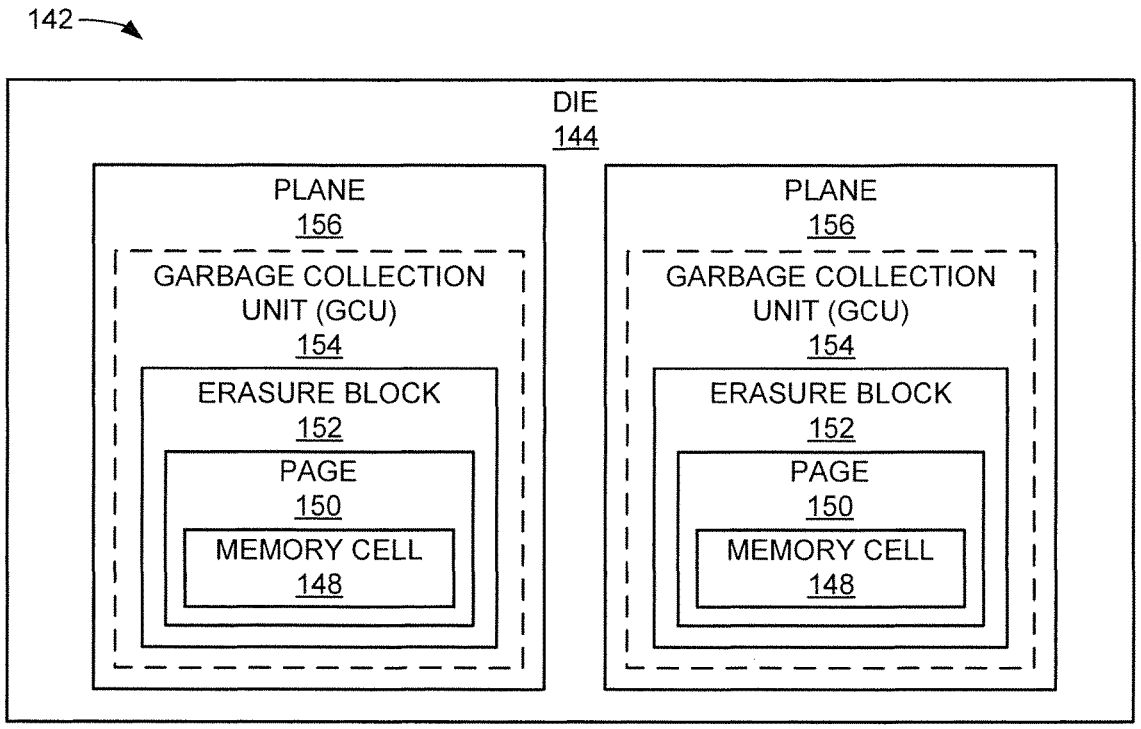
FIG. 3 is a physical and functional layout of the flash memory of FIG. 2 in some embodiments.

FIG. 3 shows a physical/logical arrangement of the various flash memory dies 144 in the flash memory 142 of FIG. 2 in some embodiments. Each die 144 incorporates a large number of flash memory cells 148. The cells may be arrayed in a two-dimensional (2D) or three-dimensional (3D stacked) arrangement with various control lines (e.g., source, bit, word lines) to access the cells.

Groups of cells 148 are interconnected to a common word line to accommodate pages 150, which represent the smallest unit of data that can be accessed at a time. Depending on the storage scheme, multiple pages of data may be written to the same physical row of cells, such as in the case of MLCs (multi-level cells), TLCs (three-level cells), QLCs (four-level cells), and so on. Generally, n bits of data can be stored to a particular memory cell 148 using $2^n$ different charge states (e.g., TLCs use eight distinct charge levels to represent three bits of data, etc.). The storage size of a page can vary; some current generation flash memory pages are arranged to store 16 KB (16,384 bytes) of user data.

The memory cells 148 associated with a number of pages are integrated into an erasure block 152, which represents the smallest grouping of memory cells that can be concurrently erased in a NAND flash memory. A number of erasure blocks 152 are turn incorporated into a garbage collection unit (GCU) 154, which are logical storage units that utilize erasure blocks across different dies as explained below. GCUs are allocated and erased as a unit, and tend to span multiple dies.

During operation, a selected GCU is allocated for the storage of user data, and this continues until the GCU is filled. Once a sufficient amount of the stored data is determined to be stale (e.g., no longer the most current version), a garbage collection operation can be carried out to recycle the GCU. This includes identifying and relocating the current version data to a new location (e.g., a new GCU), followed by an erasure operation to reset the memory cells to an erased (unprogrammed) state. The recycled GCU is returned to an allocation pool for subsequent allocation to begin storing new user data. In one embodiment, each GCU 154 nominally uses a single erasure block 152 from each of a plurality of dies 144, such as 32 dies.

Each die 144 may further be organized as a plurality of planes 156. Examples include two planes per die as shown in FIG. 3, although other numbers of planes per die, such as four or eight planes per die can be used. Generally, a plane is a subdivision of the die 144 arranged with separate read/write/erase circuitry such that a given type of access operation (such as a write operation, etc.) can be carried out simultaneously by each of the planes to a common page address within the respective planes.

Figure 4:
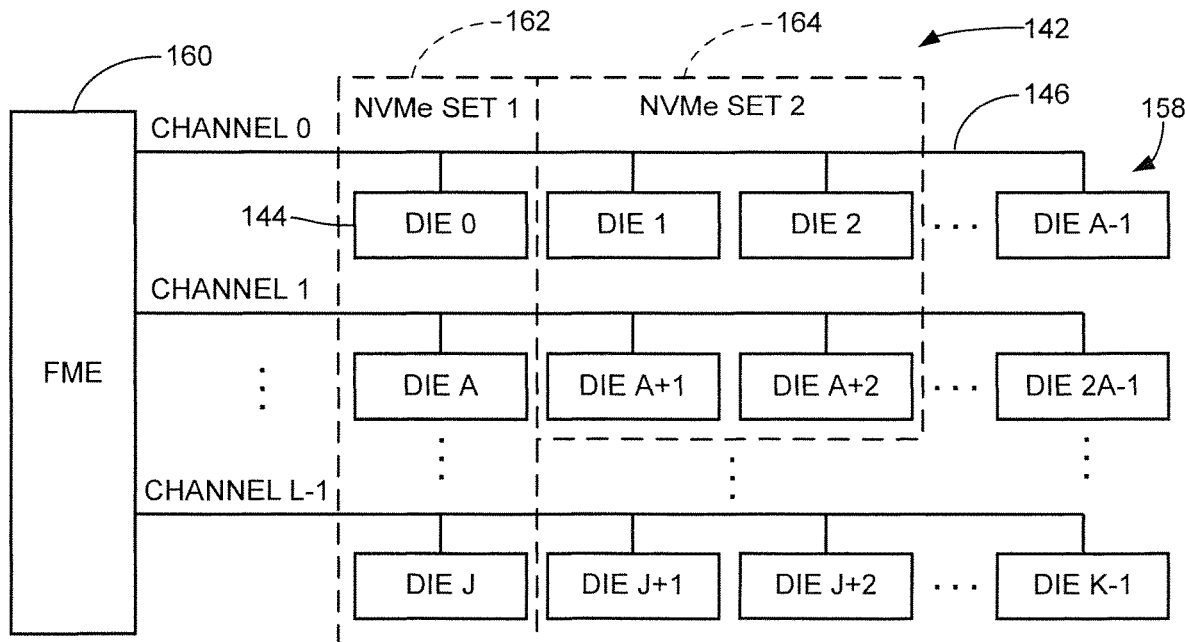
FIG. 4 shows the grouping of various dies of the flash memory of FIG. 2 in various die and NVM sets in some embodiments.

FIG. 4 shows further aspects of the flash memory 142 in some embodiments. A total number K dies 144 are provided and arranged into physical die groups 158. Each die group 158 is connected to a separate channel 146 using a total number of L channels. Flash memory electronics (FME) circuitry 160 of the flash memory module 142 controls each of the channels 146 to transfer data to and from the respective die groups 158. In one non-limiting example, K is set to 128 dies, L is set to 8 channels, and each physical die group has 16 dies. In this way, any of the 16 dies physically connected to a given channel 146 can be accessed at a given time using the associated channel. Generally, only one die per channel can be accessed at a time.

In some embodiments, the various dies are arranged into one or more NVMe sets. An NVMe set, also referred to a die set, represents a portion of the storage capacity of the SSD that is allocated for use by a particular host (user/owner). NVMe sets are established with a granularity at the die level, so that each NVMe set will encompass a selected number of the available dies 144.

A first example NVMe set is denoted at 162 in FIG. 4. This first set 162 uses a single die 144 from each of the different channels 146. This arrangement provides fast performance during the servicing of data transfer commands for the set since all eight channels 146 are used to transfer the associated data to service a host access command. A limitation with this approach is that if the set 162 is being serviced, no other NVM sets can be serviced during that time interval. While the set 162 only uses a single die from each channel, the set could also be configured to use multiple dies from each channel, such as four (4) dies per channel for a total of 32 dies.

A second example NVMe set is denoted at 164 in FIG. 4. This set uses dies 144 from less than all of the available channels 146. This arrangement provides relatively slower overall performance during data transfers as compared to the set 162, since for a given size of data transfer, the data will be transferred using fewer channels. However, this arrangement advantageously allows the SSD to service multiple NVMe sets at the same time, provided the sets do not share a common channel 146.

Figure 5:
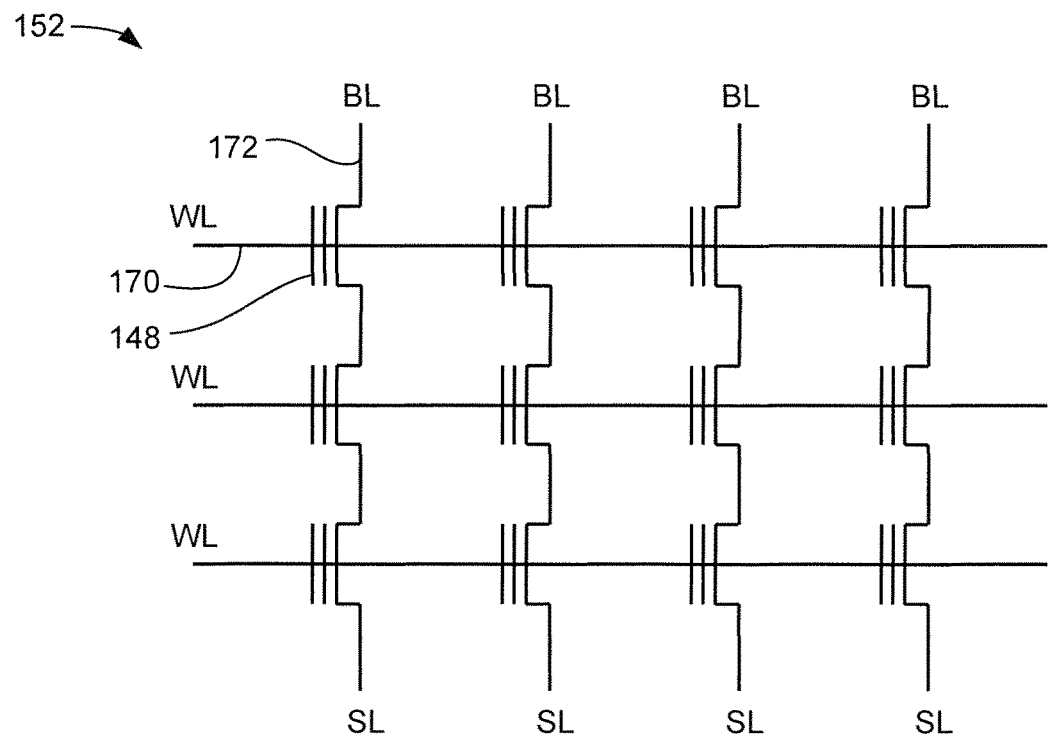
FIG. 5 provides a schematic depiction of a portion of the flash memory of FIG. 2 as operated by some embodiments.

FIG. 5 is a simplified schematic depiction of a portion of a selected erasure block 152 from FIG. 3. The flash memory cells 148 each generally take a MOSFET (metal oxide semiconductor field effect transistor) configuration with respective control gate, source and drain regions. A floating gate is isolated between the control gate and the channel between the source and drain.

The cells 148 are arranged in a matrix connected by word lines (WL) 170, bit lines (BL) 172 and source lines (SL) 174. During normal program (write) and read operations, current is passed from the BL to the SL through each stack in turn. This may take place by connecting the BL to a suitable rail voltage, such as 3.3V, and connecting the SL to a suitable reference level, such as electrical ground. The WLs 170 are connected to the control gates of the memory cells 148.

Variable gate control voltages (read voltages) are supplied to the memory cells via the WLs to read the programmed states of the cells. These voltages are applied through the use of read voltage set points that are register values that are loaded by the controller, and converted to voltages that are applied by the internal NAND read circuitry as discussed below. Pages of data are stored along the memory cells attached to a common word line (WL). Programming (write), read and erase operations may be carried out by supplying different combinations of voltages to the respective control lines to respectively apply, sense or remove accumulated charge to or from the floating gates.

Figure 6:
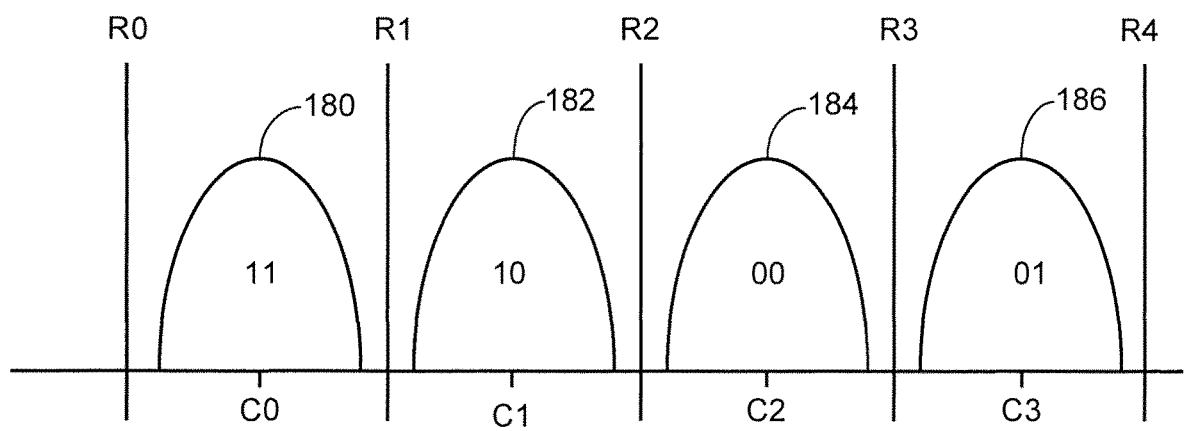
FIG. 6 shows charge distributions and associated read voltage set points for the flash memory of FIG. 2 that may be generated by some embodiments.

FIG. 6 shows different populations of charge distributions that may be applied to the various memory cells 148 in FIG. 5. For ease of discussion, FIG. 6 depicts MLC (multi-level cell) programming so that each memory cell can have up to four charge states to depict two (2) bits of programming. As noted above, other programming schemes can be used including TLC (8 charge states to depict 3 bits), QLC (16 charge bits to depict 4 bits), etc., so the depiction of MLCs is merely exemplary and is not limiting.

The four charge distributions C0-C3 are denoted at 180, 182, 184 and 186 and represent respective two-bit combinations of 11, 10, 00 and 01. Other encoding schemes can be used. For a given set of cells 148 attached to a common WL 170, the MSB stored in each cell represents a logical bit value from a first page of data and the LSB stored in each cell represents a logical bit value from a second page of data.

Of interest are respective read voltage set points (levels) R0-R4 depicted in FIG. 6. The various read voltage set points indicate register control values that are applied to generate corresponding control gate (read) voltages necessary to place the different populations of memory cells into a forward (source-to-drain) conductive state. The read voltage set point R2 is sufficient to place all of the memory cells in populations 180 and 182 in a conductive state, but not those cells in populations 184 and 186. The read voltage set point R4 is sufficiently high to place all of the cells in a forward conductive state, while the read voltage set point R0 is insufficient to place any of the cells in a forward conductive state. By applying different sequences of the read voltage set points R0-R4 during a read operation and sensing whether the associated cells become conductive, the individual charge state of the cells can be determined. It will be recognized that, in practice, only the set points R1-R3 may be used during an MLC read.

With this overview of the SSD 110 of FIG. 2, further details regarding various embodiments will now be discussed beginning with reference to FIGS. 7A and 7B.

Figure 7A:
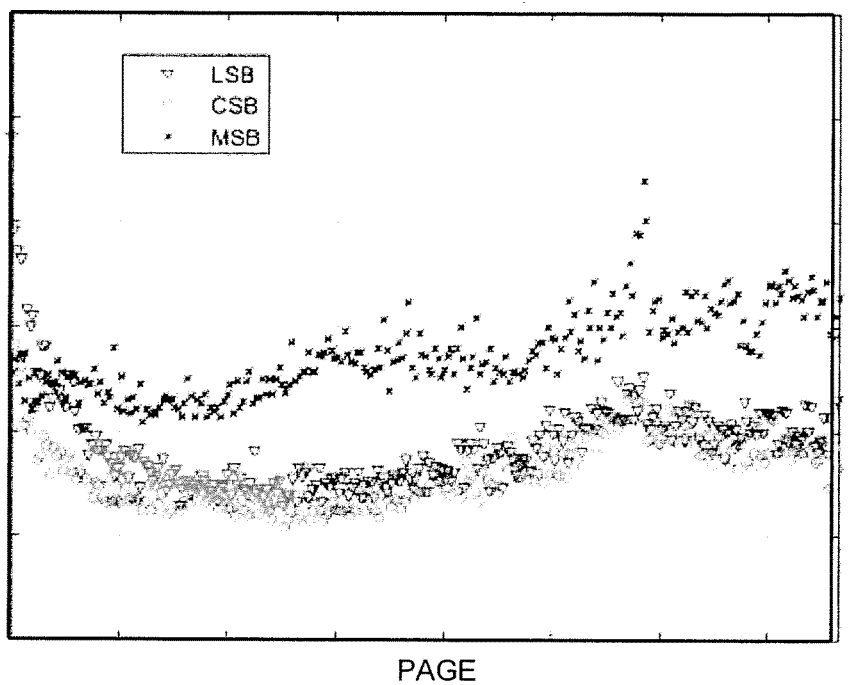
FIGS. 7A and 7B show graphical depictions of changes in bit error rate (BER) performance for different cross-temperature differentials (CTDs), page types and locations of the SSD of FIG. 2.

FIG. 7A shows a graphical representation of BER data for different pages that have a relatively low CTD value (e.g., both program and read temperatures were near the same temperature). The data are plotted for TLC cells (three bits per cell) for both reads on the least, center and most significant bits (LSB, CSB and MSB). It can be seen that, generally, steady state BER values can be obtained across a large sample of page values. The MSB page type and some initial WL locations show higher error rates than for other page types and locations.

Figure 7B:
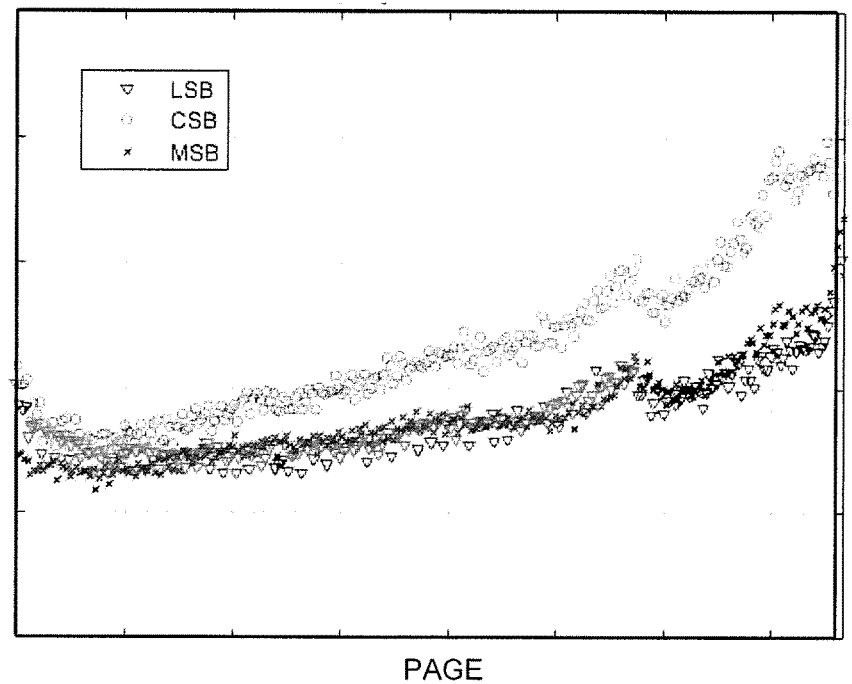

By contrast, FIG. 7B shows a graphical representation of BER data for pages that have a relatively high CTD value (e.g., a read temperature that was about 70° C. higher than the program temperature). In this case, the BER values in FIG. 7B are several multitudes higher (e.g., 4× to 20× or more) as compared to the BER values in FIG. 7A. The graph in FIG. 7B shows particular sensitivity to the cross-temperature effect for CSB page type and different WL locations.

One reason that temperature excursions such as in FIG. 7B lead to increased BER values relates to charge drift; at higher temperatures, the various memory cells become conductive at different control gate (read) voltage levels so that the voltages R0-R4 in FIG. 6 may not be sufficient to accurately discern the programmed state of the individual cells.

Figure 8:
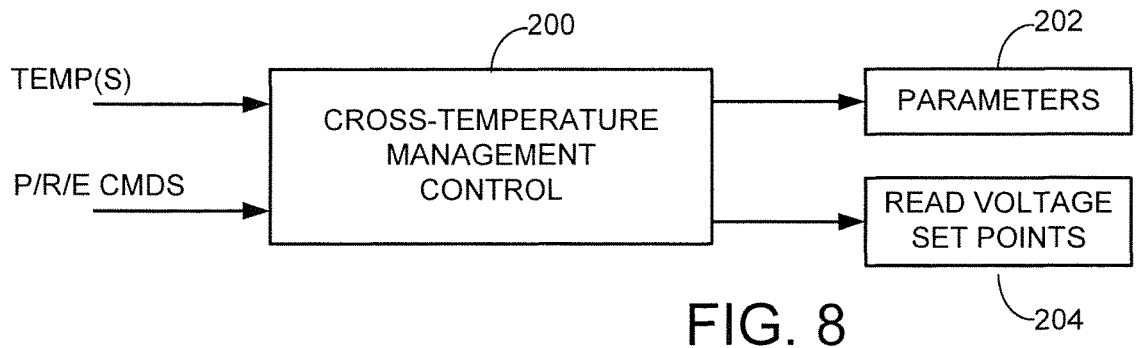
FIG. 8 is a functional block representation of a cross-temperature management control (CTMC) circuit constructed and operated in accordance with some embodiments.

Accordingly, FIG. 8 shows a functional block representation of a cross-temperature management control (CTMC) circuit 200 that operates to compensate for these and other limitations of the existing art. The CTMC circuit 200 can take a variety of forms based on the requirements of a given application. It is contemplated in some embodiments that the CTMC circuit 200 represents one or more firmware routines stored in a suitable memory location and executed by one or more processors of the SSD controller 112 discussed above (see FIG. 2). Other circuit configurations can be used.

Generally, the CTMC circuit 200 operates as a background process to perform preemptive parametric adjustment operations. The operations involve monitoring the state of the SSD 110 and implementing parametric adjustments as required to improve the readback performance of the SSD in view of CTD effects.

The CTMC circuit 200 receives various inputs including one or more temperature readings from one or more temperature sensors (such as, e.g., temperature sensor 132 in FIG. 2). The sensors can include a single sensor adjacent the controller or adjacent the various flash memory dies, or multiple temperature sensors distributed throughout the system (including a separate temperature sensor on each die). Other parametric data can be supplied to the CTMC circuit 200, such as resistance or power measurements, to extrapolate a temperature level based on these or other factors.

The CTMC circuit 200 monitors ongoing program, read and erase (P/R/E) commands that are issued to the memory. This allows the CTMC circuit 200 to generate a parameter data base 202 arranged as a data structure in a memory (such as a table) that lists, by data set and memory location, various parameters such as a measured program temperature, date/time code information, existing program verify and read voltage values, P/E counts, read counts and so on associated with each data set that is stored in the memory.

The CTMC circuit 200 further generates and manages a master read voltage table 204 arranged as a data structure in memory that lists appropriate read voltage set points that should be applied to retrieve the various data sets from the various locations during read operations. The CTMC can establish read voltage set points for different portions of the memory at any desired granularity (e.g., die, plane, GCU, erasure block, WL, cell(s), etc.).

The read voltage set points are selected for the current conditions of the SSD and are established in the background independently of the servicing of a read command for a selected data set. In this way, suitable read voltage set points will be preemptively selected and available for use during the servicing of the next host read command issued by a host device or a read command issued to carry out a garbage collection operation.

Figure 9:
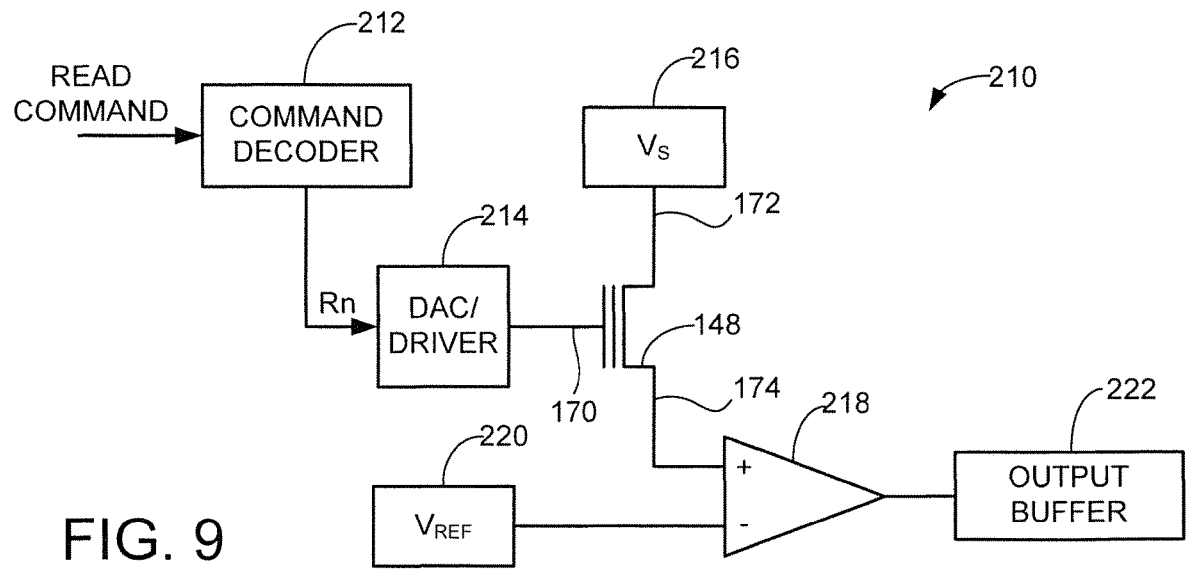
FIG. 9 shows a read/program verify circuit of the SSD NAND memory module of FIG. 2 that operates in conjunction with the CTMC circuit of FIG. 8 in some embodiments.
Figure 10:
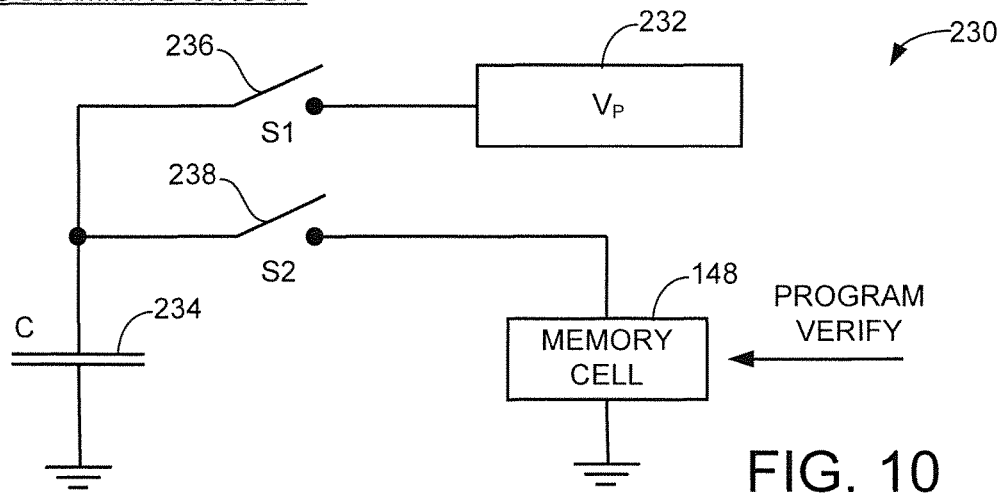
FIG. 10 shows a programming circuit of the SSD of FIG. 2 that operates in conjunction with the CTMC circuit of FIG. 8 in some embodiments.

To this end, FIGS. 9 and 10 have been provided to describe ways in which data may be programmed to and read from a selected memory cell using the read voltage set points from the data structure 204. It will be appreciated that these techniques are successively applied to each of a group of memory cells (such as a row of memory cells in a selected erasure block) to write and read a page of data, respectively. The circuits in FIGS. 9 and 10 represent internal NAND processing circuits of the flash memory 140, and therefore may take other forms as required.

FIG. 9 is a functional block representation of a read/program verify (PV) circuit 210 of the SSD 110 in accordance with some embodiments. The circuit 210 is adapted to apply read voltage set points during read operations to detect the program states of the respective memory cells 148 in the array 140, such as the read voltage set points R0-R4 in FIG. 6. Program verify operations during programming can also be carried out by the circuit, or a different dedicated circuit having a similar construction.

A command decoder 212 decodes an input read command and applies an appropriate read voltage set point value Rn to a digital-to-analog (DAC) driver circuit 214. The read voltage set point value Rn is a multi-bit digital representation of a corresponding selected analog control gate voltage value having a magnitude nominally selected to place the memory cell 148 in a forward conductive state based on the programmed state of the cell. The DAC/driver 214 applies an output to the control gate of the selected cell 148 via the associated word line (WL) 170 (see FIG. 5). The read voltage set points (Rn), also referred to as read levels, are stored and applied as integers corresponding to DAC input values over the available DAC range.

A voltage source 216 applies a suitable source voltage $V_S$ to the bit line (BL) 172 coupled to the memory cell 148 being read. A sense amplifier 218 coupled to the source line (SL) 174 determines whether the applied voltage is sufficient to place the cell into a conductive state through a comparison with a reference voltage $V_{REF}$ from a reference voltage source 220. A resulting bit value is output to an output buffer 222 (e.g., a 0 or 1) responsive to the comparison.

FIG. 10 is a functional block representation of a data programming circuit 230 of the SSD 110. The circuit 230 is configured to transfer charge to the floating gates of the various memory cells 148 during programming operations.

The circuit 230 takes a general charge pump configuration with a programming voltage source 232 that supplies a suitable programming voltage $V_P$, a capacitor (C) 234 or other charge storage device, and a pair of switches 236, 238 denoted as switches S1 and S2. The switches can take any suitable form such as power MOSFETs.

The circuit operates to transfer discrete quanta of charge to the floating gate. To this end, one or more charge-transfer cycles are applied to the memory cell. During a charge cycle, switch S1 is closed, switch S2 is opened, and charge accumulates as the voltage $V_P$ is applied to the capacitor C. During a transfer cycle, switch S1 is opened and switch S2 is closed, enabling a transfer of the charge accumulated by the capacitor C to the memory cell 148.

The foregoing sequence is repeated as required until the total amount of accumulated charge on the floating gate of the memory cell 148 reaches a desired level indicative of the programming of the cell to the desired programmed state. A program verify operation is periodically carried out to assess the then-existing program state of the cell, using the read circuit 210 of FIG. 9. A suitable program verify threshold is used, which may be different from the various read voltage set points depicted in FIG. 6.

Program verify and read operations are carried out in a similar fashion. One difference is that a read operation for a memory cell storing more than a single bit may require multiple different voltage thresholds to discern the program state, whereas a program verify operation may involve the application of only a single voltage to ensure sufficient charge has been accumulated on the floating gate.

As noted above, a large differential between the temperature at which a data set is programmed as compared to the temperature at which the data set is subsequently read can result in significant shifts in the effective voltage required to discern the associated programming state for the cells storing the data set. The CTMC circuit 200 of FIG. 8 proactively operates to continually assess the appropriateness of the existing read voltage set points based on the current temperature and, as required, operates to either select new, more optimized read voltage set points or, in some cases, relocate the data to a new location.

Figure 11:
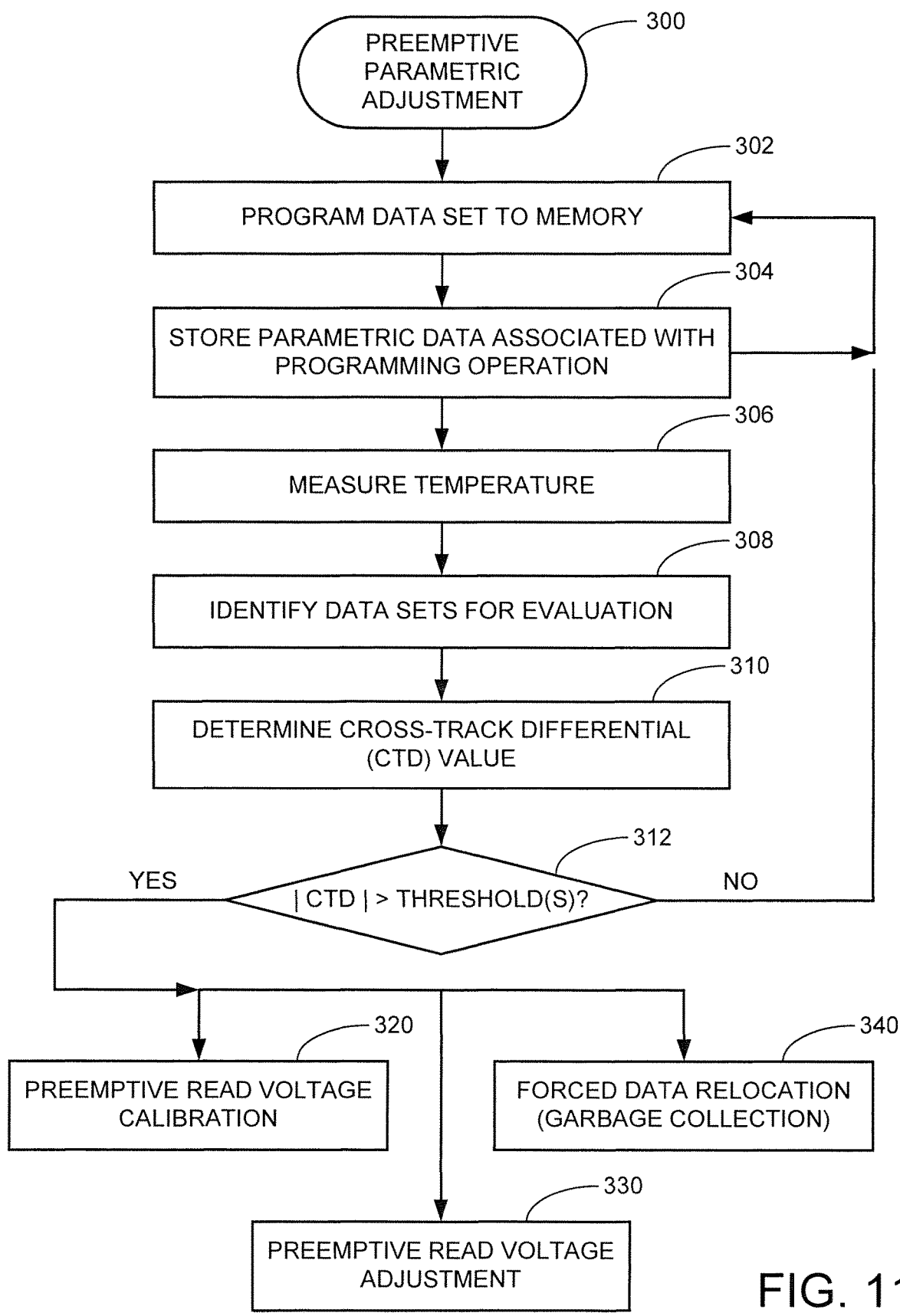
FIG. 11 is a flow chart for a preemptive parametric adjustment routine illustrative of steps carried out by the CTMC circuit of FIG. 8 in some embodiments.

FIG. 11 sets forth a flow chart for a preemptive parametric adjustment routine 300 that is carried out by the CTMC circuit 200 in accordance with some embodiments. The routine is recursive and will be continuously carried out as different data sets are written to the NVM at different times during the operation of the SSD 110. The routine is merely illustrative and other steps may be taken as desired in accordance with the present disclosure.

Various data sets are programmed to the memory as required at step 302, and parametric data values associated with the programming of the data are collected and stored at step 304 (see parameter block 202 in FIG. 8). One such parametric data value may be a temperature at the time of programming ("Tprogram"). Another parametric data value may be a date/time code stamp. This sequencing of steps 302 and 304 continues as new data sets are programmed to new locations in the memory. The data sets can take any suitable form, including RAID stripes, code words, etc. The data sets may be successively written to one or more allocated and available GCUs.

At step 306, periodic temperature measurements are taken of the memory. Each measurement can be a single temperature measurement, or multiple measurements at different locations within the device. The current temperature measurement ("Tcurrent") may be obtained at a regular interval. Smoothing over several successive intervals may be used to avoid reacting to short transients. In one example, temperature samples may be taken once per minute and smoothed over a 10 minute window using a running average to represent the Tcurrent value. Weighted Tcurrent values can be generated using different temperature sensors at different locations. Other approaches may be used as desired.

At step 308, at least some, if not all, of the existing data sets currently stored in the memory are identified for evaluation. As noted above, data sets that have been recently programmed may be excluded from the analysis on the basis that the current temperature is the same or near the temperature at the time of programming. In some cases, a sorting operation may take place to begin with the oldest existing data sets in the memory and work forward from there. In other cases, analysis may be carried out on a per GCU basis in turn.

A CTD value is determined at step 310 for each data set identified for evaluation in step 308. In some cases, the CTD value may be determined by establishing the difference between the Tcurrent value obtained in step 306 and the Tprogram value obtained in step 304. Other forms of CTD values may be additionally or alternatively calculated at this point, such as the difference between the Tcurrent value and a calibration temperature value Tcal (the temperature at the last read current calibration operation), as discussed below.

It is contemplated that during steady state conditions, few if any of the data sets may actually require parametric adjustment at any given time. Nevertheless, for each data set found to have a CTD value that exceeds a predetermined threshold value T, parametric adjustments are carried out, as indicated by decision step 312. It will be appreciated these may be provided at a word line granularity or at some other granularity.

The various adjustments can include one or more of the following:

Step 320 shows a preemptive read voltage calibration routine that can be carried out to generate new, suitable read voltage set points for the errant data sets.

Step 330 shows a preemptive read voltage adjustment routine that can be carried out to apply suitable increments to the existing read voltage set points to provide new, optimized read voltage set points.

Step 340 shows a preemptive forced garbage collection routine that can be carried out to relocate the data set to a new location within the memory, at which point new read voltage set points are assigned for use at the new location.

These various routines 320, 330 and 340 are respectively characterized herein as different, albeit related, types of preemptive parametric adjustment operations. The preemptive parametric adjustment operations may be applied to different data sets based on a number of factors including PE counts, data aging, read counts, locations and the magnitude of the estimated CTD value(s). Each of these preemptive parametric adjustment operations will now be discussed in turn.

Figure 12:
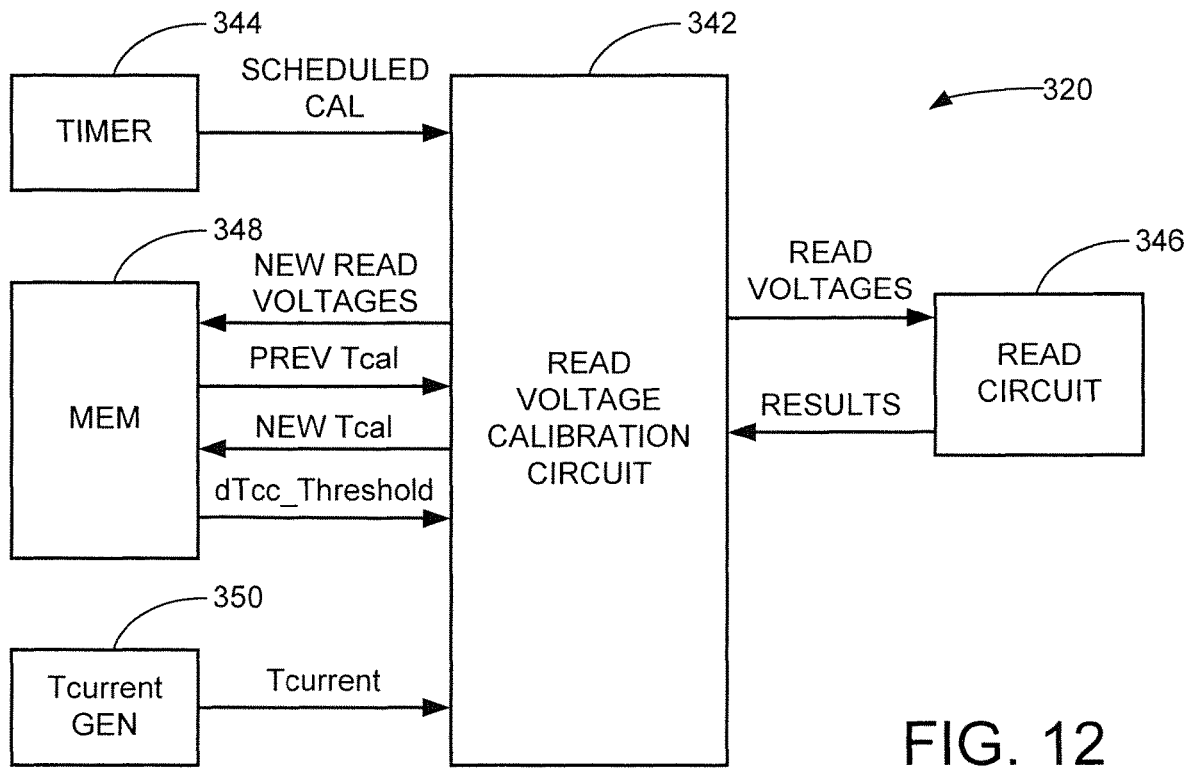
FIG. 12 is a functional block diagram for a read voltage calibration circuit of the CTMC circuit of FIG. 8 in some embodiments.

FIG. 12 corresponds to the preemptive read voltage calibration routine 320 in FIG. 11. A read voltage calibration circuit 342 is provided as a portion of the CTMC circuit 200 of FIG. 8. The circuit 342 is configured to carry out periodic read voltage calibration operations on various locations within the memory 140 on a regularly scheduled basis, as well as preemptive read voltage calibration operations when deemed necessary by the routine of FIG. 11.

The timing of the scheduled read calibration operations can be established by a timer circuit 344 that periodically signals the appropriate times at which new calibrations should be carried out to various portions of the memory 140. The frequency of the scheduled calibrations can be determined empirically and can remain constant during the lifetime of the memory, or can be adjusted based on various factors such as PE counts, aging, etc.

The regularly scheduled read voltage calibrations can include the application of different read voltage set points by a read circuit 346 (generally corresponding to the internal NAND read circuit 210, FIG. 9) to discern different bit outputs from a selected group of memory cells at the selected memory location.

This processing may include incrementally adjusting one or more of the various read voltage set points (such as R0-R4 in FIG. 6) during repetitive read operations. Signal processing such as LDPC (low density parity check) may be applied to the output of the read operations in a known manner to assess bit error performance.

The process culminates in the identification of a set of new read voltage set points that provides a minimum number of bit errors for the data. The new read voltage set points are stored in a suitable memory 348 and thereafter used during subsequent reads to that location.

The current temperature Tcurrent is provided to the read voltage calibration circuit 342 from a Tcurrent generator (GEN) circuit 350 using inputs from the various temperature sensor(s) in the system. The associated Tcurrent value at the time of calibration is stored as a "Tcal" value in the parameter memory 348. Other data associated with the calibration process may be stored at this time as well.

With reference again to step 320 in FIG. 11, the preemptive read voltage calibration operations are further carried out by the read voltage calibration circuit 342 of FIG. 12 as follows.

The temperature Tcurrent is monitored and derived on a regular interval as discussed above. A delta value "dTcc" between the current temperature Tcurrent and the effective temperature Tcal that was measured during the most recent calibration is determined as follows:

$$dTcc = Tcurrent - Tcal \quad (1)$$

The absolute magnitude of dTcc, |dTcc|, is next determined, and this value is compared to a calibration threshold dTcc_Threshold as follows:

$$|dTcc| > dTcc\_Threshold \quad (2)$$

The threshold value may be determined in a variety of ways including empirical analysis of the associated location in the NAND flash memory. Should the magnitude of the delta exceed the threshold, a new read voltage calibration process is scheduled and performed by the circuit 342 for the selected location.

During the read voltage calibration process, the Tcurrent value is noted and stored as the latest Tcal value. After calibration is completed, the read voltage set points are established and stored per die, and per set of WLs for each read reference level. As noted above, the number of Rn levels depends on the NAND-type. For SLC, there is a single set point (e.g., voltage V2 in FIG. 6). For MLC, there are three set points (e.g., voltages R1, R2 and R3 in FIG. 6). TLC provides a total of seven set points (R1-R7), and QLC provides 15 set points (R1-R15). For bit decisions on a given NAND page type, one or more Rn levels will be involved, depending on the storage state of the NAND flash cells. As will be appreciated, to decode data bits on a given page type correctly, each of the Rn levels associated with that page type need to be set with appropriate read voltage values.

As desired, the foregoing steps can be repeated to confirm the successful completion of the read voltage process. A flag bit or other notification can be established for the calibrated location in the parameter data structure (block 202, FIG. 8) to indicate the successful completion of the most recent read calibration process.

In this approach, read voltage calibration operations can be carried out during the normally scheduled intervals, and additional preemptive read voltage calibration operations can be performed as required when excessive cross-track differential (CTD) values are obtained based on differences in temperature since the most recent calibration.

In other related embodiments, the preemptive read voltage calibration process can be carried out using different thresholds based on the sign (positive or negative) of the dTcc value. In this case, a first threshold may be used for a positive dTcc value and a different, second threshold may be used for a negative dTcc value.

In still other related embodiments, the preemptive read voltage calibration process can be carried where the dTcc_Threshold value is a function of PE count, aging, read counts, or a combination of these or other parameters. In this way, the read voltage calibration process may be invoked more frequently due to a relatively large number of program/erase cycles, or a relatively large number of reads that have taken place since the most recent erasure, and so on.

Figure 13:
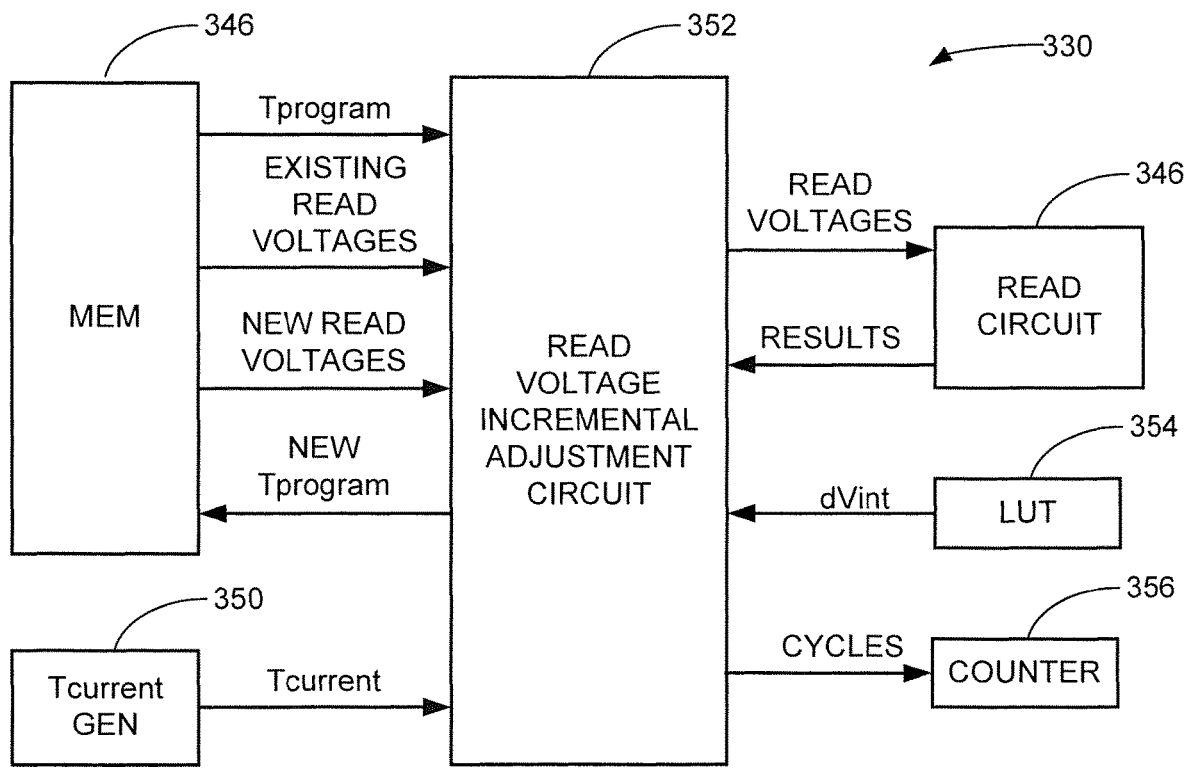
FIG. 13 is a functional block diagram for a read voltage incremental adjustment circuit of the CTMC circuit of FIG. 8 in some embodiments.

FIG. 13 illustrates an exemplary manner in which the CTMC circuit 200 performs the preemptive read voltage adjustment routine 330 of FIG. 11. In this case, a read voltage incremental adjustment circuit 352 operates to add one or more increments of read voltage to the existing read voltage set points for the associated location to arrive at new, adjusted read voltage set points which are stored for subsequent use.

As described above, the Tprogram value is retrieved, such as from the parameter memory 348, and compared to the Tcurrent value from the Tcurrent generator 350, to determine a CTD value referred to as "dTpc" as follows:

$$dTpc = Tcurrent - Tprogram \quad (3)$$

Read voltage adjustment is carried out responsive to the dTpc value exceeding a selected threshold "dTpc_Threshold" as follows:

$$|dTpc| > dTpc\_Threshold \quad (4)$$

This analysis can be carried out on a per GCU basis, or on some other granularity within the memory 140. The dTpc_Threshold can be the same as, or different from, the dTcc_Threshold discussed above.

The read voltage incremental adjustment circuit 352 next derives an appropriate read voltage shift increment "dV" for each read voltage level. In some embodiments, the increments may be established in accordance with the following relation:

$$dV = C1(PE, Rn, WLn, Tprog) \cdot dTpc + C2(PE, Rn, WLn, Tprog) \quad (5)$$

where C1 and C2 are coefficients based on NAND characterization in cross-temperature conditions for a given NAND type. Each of the coefficients C1 and C2 are a function of PE count (PE), read level (Rn) word line location/count (WLn) for a given NAND type, and Tprogram (Tprog). Other derivation approaches can be used.

Figure 14:
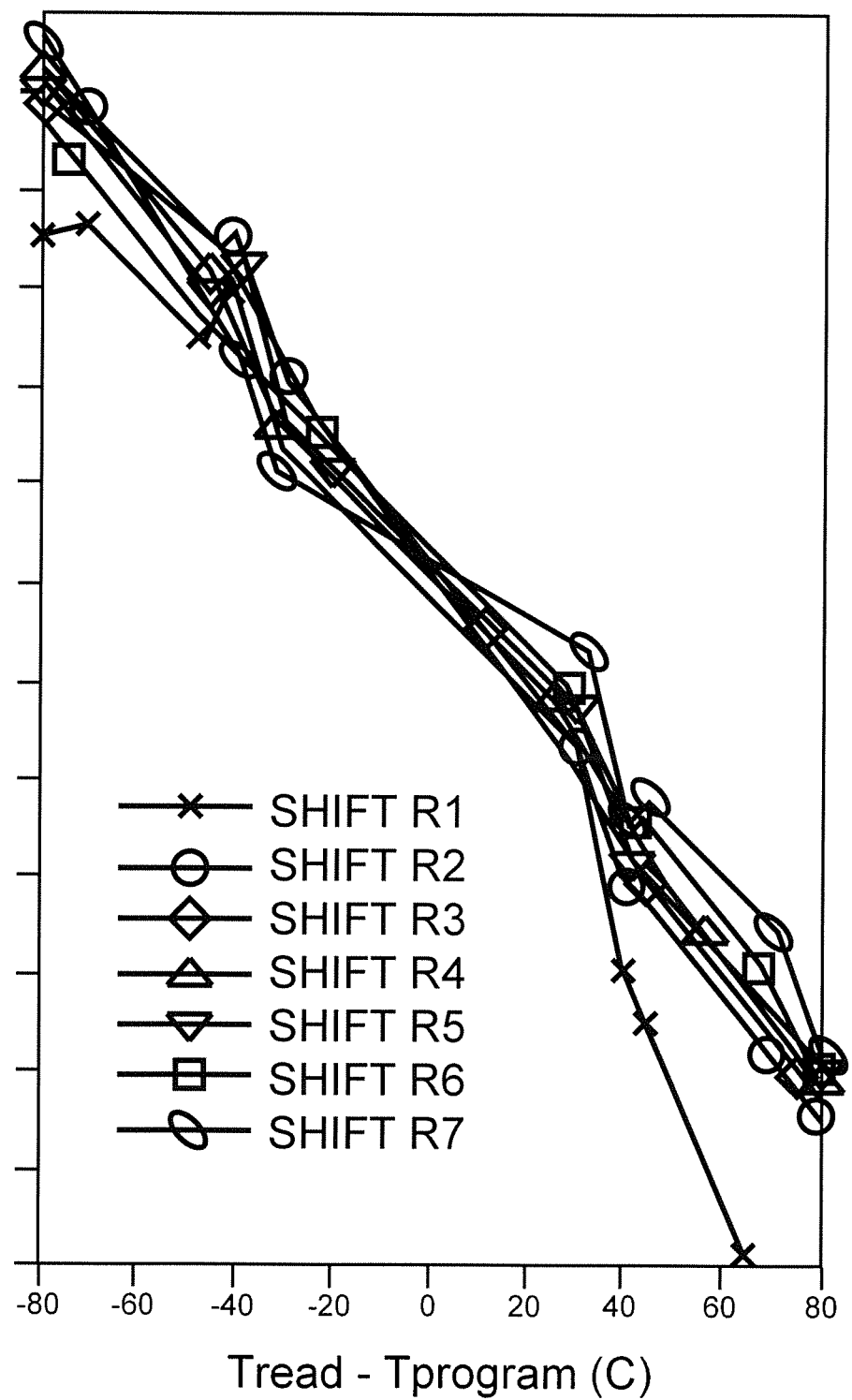
FIG. 14 is a graphical representation of different increments that may be generated and applied by the circuit of FIG. 13 for different read voltage types and different cross-temperatures.

Exemplary characterizations are depicted in FIG. 14 for TLC memory cells with seven (7) read voltage levels (R1-R7). As can be seen in FIG. 14, different step amounts may be applicable based on different CTD values. Data such as presented in FIG. 14 can be readily determined based on empirical analysis of a given memory.

As required, the resulting dV value from equation (5) may be rounded to the nearest DAC increment to provide a multi-bit integer value dVint. The dVint increment may have either a positive or a negative sign as required. The dVint increment is added to an existing read voltage value Rn as follows to provide an adjusted read voltage value ARn:

$$ARn = Rn + dVint \quad (6)$$

The new updated read voltage set points Arn are thereafter stored in the parameter memory 348 and used for subsequent read operations. A new Tprogram value may also be stored corresponding to the current temperature Tcurrent.

Various alternatives may be implemented as desired. In some cases, the values of dVint are pre-calculated as a function of dTpc for PE regions by Rn and WLn (or set of WLn) and stored in a lookup table, such as LUT 354. In other cases, dV is based on a linear curve function using different coefficients C1 and C2 depending on the sign of dTpc. In still other cases, curve fit coefficients are based on Tprogram as well.

Further alternatives include maintaining accumulated counts of how many times the read voltage set points have been updated by the circuit 352. A counter 356 can be used for this purpose. Once the counter reaches a predetermined count, a garbage collection operation can be carried out to relocate the data to a new location.

It will be appreciated that in write dominated workloads, user data sets tend to be written at a relatively high rate, so that most or all of the data in a given GCU will tend to have the same or similar data aging and Tprogram values. However, in read dominated workloads, data sets within a given GCU may have widely varying data aging and Tprogram values.

The foregoing discussion has contemplated that the same Tprogram value may be retrieved for all of the data in a given GCU, but in other embodiments, the Tprogram value can be based on the average temperature for subsequent page program passes.

Sizable temperature deltas can be addressed by keeping track of the lowest Tprogram value from the GCU ("Tprogram_low") and the highest Tprogram value from the GCU ("Tprogram_high"). Forcing or prioritizing garbage collection of the GCU can be carried out if the delta between the highest and lowest program temperatures exceeds a predetermined threshold value dTgcu, as follows:

$$dTgcu < Tprogram\_high - Tprogram\_low \quad (7)$$

As before, the dTgcu threshold can be a function of PE counts, retention, read disturb or other parameters and can thus change over time.

It follows that the routine 330 of FIG. 11 can operate to adjust individual read voltage sets for different locations in the memory in a fast and effective manner without the need to perform a full calibration as with the routine 320.

Figure 15:
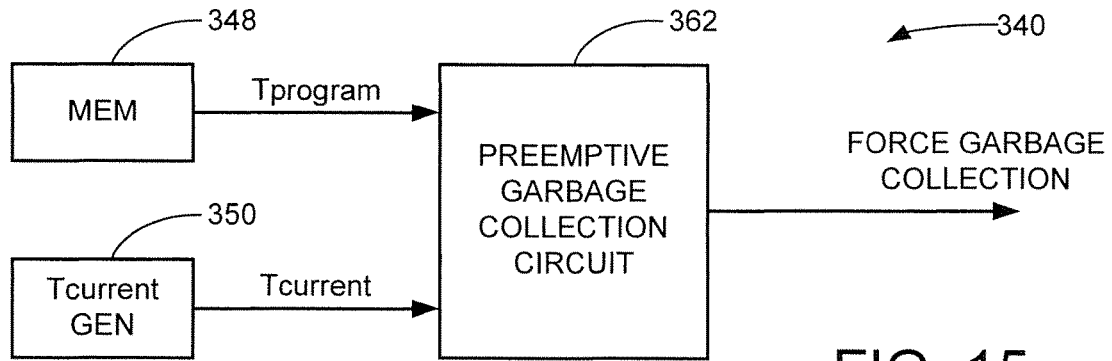
FIG. 15 is a functional block diagram for a preemptive garbage collection circuit of the CMTC circuit of FIG. 8 in some embodiments.

FIG. 15 illustrates an exemplary manner in which the CTMC circuit 200 performs the forced data relocation routine of step 340 in FIG. 11. In this case, a preemptive garbage collection circuit 362 operates to relocate the data sets affected by a large CTD by forcing a garbage collection operation to program the current version data sets to a new location and to refresh the existing location for receipt of new data. By definition, the programming of the relocated data will be at the current temperature Tcurrent.

As before, the system operates as discussed above to store, per GCU, per RAID stripe, etc., temperature information at the time of programming (Tprogram), as well as to continuously monitor and assess the current temperature Tcurrent. A dTpc value is determined by the circuit 362 in accordance with equation (3) above. A garbage collection threshold dTgc_Threshold is identified and compared to the magnitude of the dTpc value as follows:

$$dTpc > dTgc\_Threshold \quad (8)$$

If the magnitude exceeds the dTgc_Threshold limit, the system proceeds to initiate or prioritize garbage collection for the associated GCU. As before, the dTgc_Threshold may be the same or different from the respective dTpc_Threshold and the dTcc_Threshold. In some cases, the specific routine 320, 330 or 340 may be carried out based on where the measured CTD value falls with respect to these various thresholds; for example, a read voltage calibration or adjustment may be carried out if the magnitude of the dTpc value is less than the garbage collection threshold, but is still greater than some other lower threshold, etc.

As noted above, garbage collection is carried out on a GCU basis (see e.g., GCU 154, FIG. 3) and generally includes the use of the map structures maintained by the controller 112 to identify current version data sets within the selected GCU. The current version data sets are read out of the selected GCU and written to a new, available GCU, after which the selected GCU is erased and returned to an allocation pool pending allocation for the storage of new data sets.

The forcing of garbage collection based on temperature differentials provides a straightforward way to rewrite the current version data at the new current temperature rather than adjusting various other parameters such as read voltage set points as described above and maintaining the data set in its existing location. It will be appreciated that forcing a garbage collection operation in accordance with the routine 340 nevertheless results in a parametric adjustment to the system, in that the data are relocated and various metrics and parametric data, including new read voltage set points, are recorded for future use.

Various alternatives are contemplated. These include the use of different thresholds depending on the sign of the value dTpc, so that a first threshold may be used if the differential is negative and a different, second threshold may be used if the differential is positive.

Figure 16:
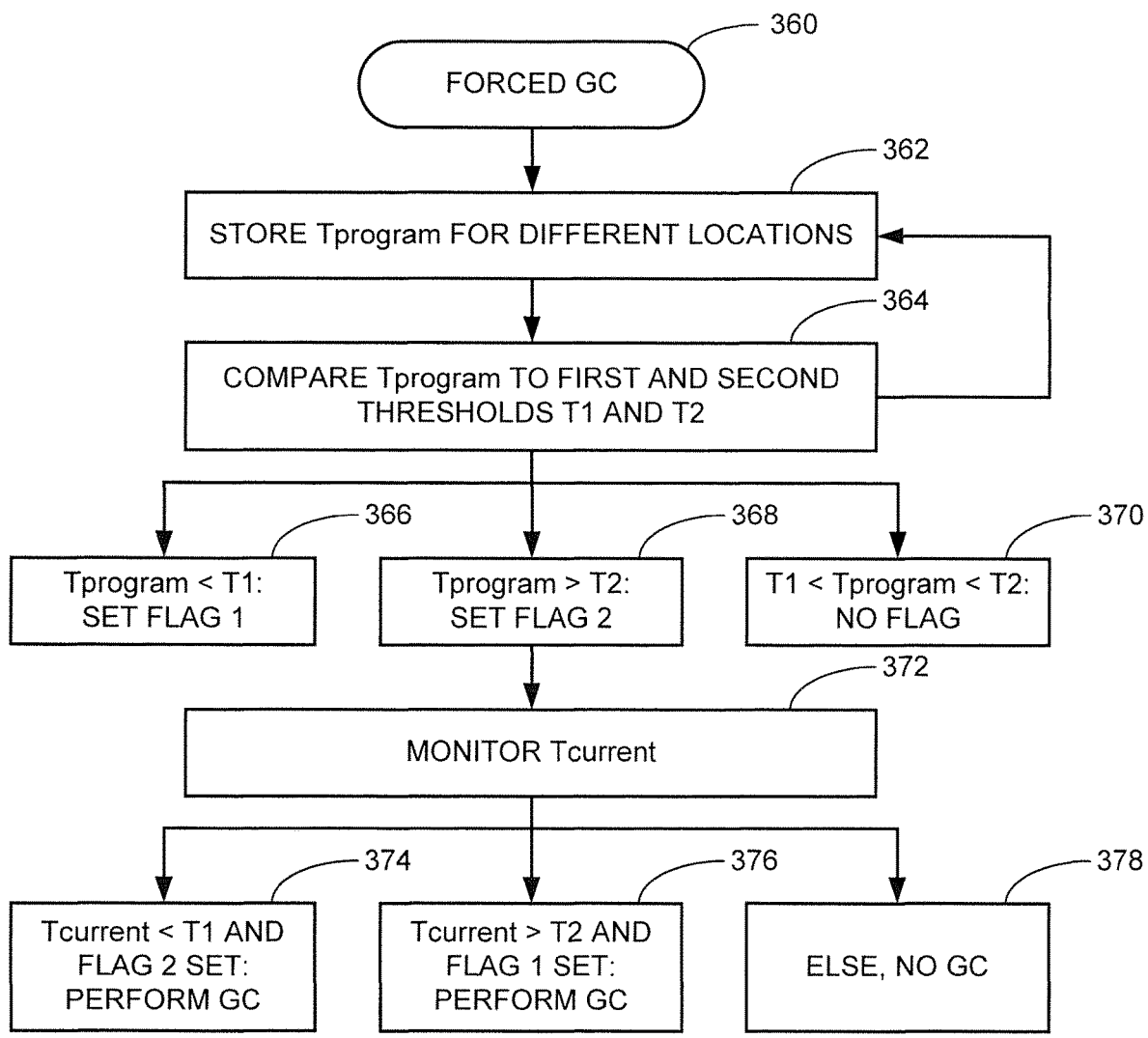
FIG. 16 is a flow chart for a forced garbage collection (GC) routine carried out by the circuit of FIG. 15 in some embodiments.

Another more complex approach to forced garbage collection is set forth by FIG. 16, which shows a forced GC routine 360. This approach generally operates to pre-set the system based on different ranges of Tprogram.

At step 362, the system stores the current Tprogram data during the writing of data, such as on a GCU or RAID stripe basis, or some other appropriate granularity. Tprogram is compared to first and second thresholds T1 and T2 at step 364.

If Tprogram is less than T1, a first flag (Flag 1) is set at step 366; if Tprogram is above T2, a second flag (Flag 2) is set at step 368; and if Tprogram is between T1 and T2, no flag is set, as shown by step 370.

Thereafter, the current temperature Tcurrent is monitored as described above on a regular basis, step 372. As shown by step 374, if Tcurrent is less than T1 and Flag 2 is set, a garbage collection/relocation operation is commanded. Similarly at step 376, if Tcurrent is greater than T2 and Flag1 is set, a garbage collection/relocation operation is also commanded. Otherwise, the system proceeds as currently configured, step 378.

An advantage of the approach in FIG. 16 is that the CTD values are predetermined by range, so it can be efficient to simply determine whether the respective flags have been set and to perform a simple comparison of the current temperature Tcurrent to the two thresholds to make the determination whether or not to proceed with a data relocation.

An alternative embodiment to those discussed above with regard to the routine of FIG. 16 is the selection of the T1 and T2 thresholds as a function of PE counts, data retention, read counts, and/or other factors. This adaptively adjusts the thresholds over time.

In other cases, subsets of stripes with WLn and page numbers may exhibit strong cross-temperature BER sensitivity over time. These locations can be identified and, as required, selected stripes (or other data sets) can be moved more frequently.

As noted above, not all of the pages in a given GCU block may have been programmed at the same program temperature Tprogram. As such, large temperature changes can be addressed by tracking the lowest and highest Tprogram values for a selected GCU and forcing garbage collection if the delta between the highest and lowest Tprogram values exceed a predetermined value, as provided above in equation (7).

The preemptive parametric adjustment operations of the CTMC circuit 200 of FIG. 8 can be carried out as required, including on a GCU basis, a RAID stripe basis, an erasure block basis, a page/WL basis, or on an individual cell/subgroup of cell basis. Moreover, different NVMe namespaces within the same memory device can be configured to utilize different levels of preemptive operation.

Figure 17:
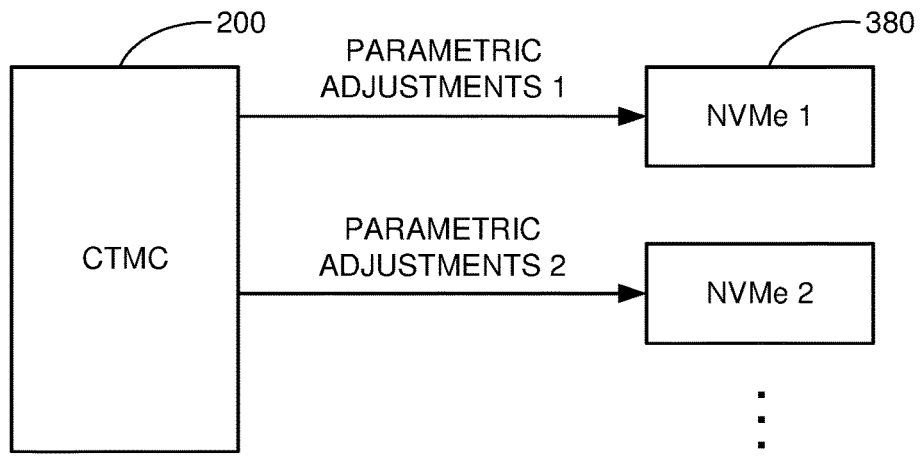
FIG. 17 shows an exemplary operation of the CTMC circuit of FIG. 8 in managing portions of the NVM of the SSD of FIG. 2 arranged into different NVMe Namespaces.

To this end, FIG. 17 shows an interaction between the CTMC circuit 200 and a number of NVMe Namespaces 380. Different parametric adjustments can be applied to these respective namespaces as required by the owners of the namespaces, as well as based on other factors such as periods of I/O deterministic operation in which specified levels of performance are guaranteed by the SSD 110 in accordance with the NVMe Standard.

Figure 18:
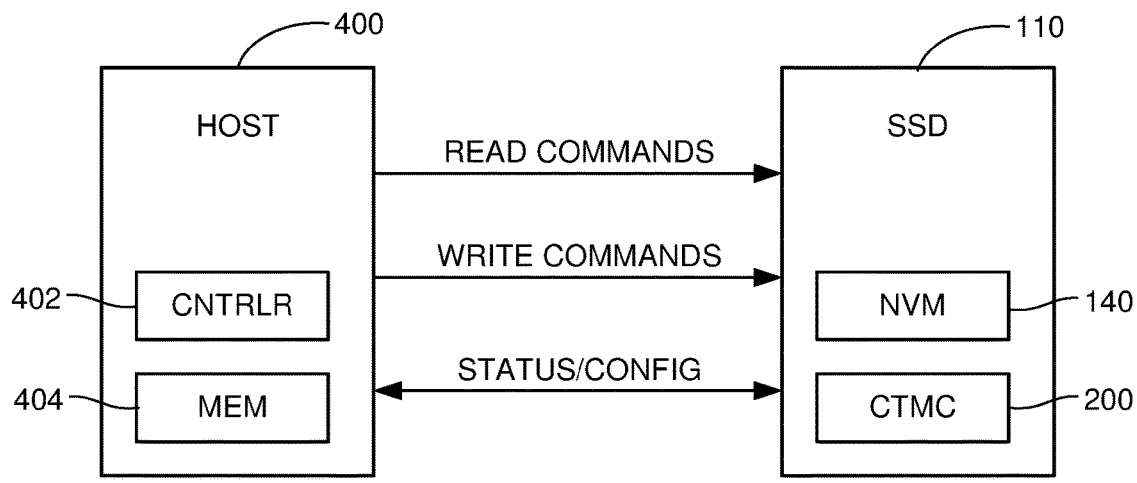
FIG. 18 shows the SSD of FIG. 2 operably coupled to a host device.

FIG. 18 shows the SSD 110 coupled to a host device 400. The host device 400 can take any number of forms including but not limited to a RAID controller, an NVMe controller, a server, a workstation, a computer, etc. The host device 400 includes a top level controller 402 and associated host memory 404.

Generally, during system operation the host device 400 will issue various write and read commands to transfer data to and from the NVM 140 of the SSD 110, and these commands will be serviced in a manner discussed above.

The CTMC circuit 200 will concurrently operate in the background to measure the current temperature of the NVM 140 on an ongoing regular basis and, at such times that an excessive cross-track difference interval is detected, to apply one or more of the preemptive parametric adjustment operations to the NVM responsive to a magnitude of the difference interval.

The preemptive parametric adjustment operations are implemented by the CTMC circuit 200 independently of the presence of any read commands from the host 400 associated with the data. That is, it is the detection of the difference interval that initiates the parametric adjustment and development of the new set of read voltage set points for the existing data sets in the NVM, without regard to and irrespective of the presence of any pending or issued read and/or write commands from the host 400 for the data sets.

It follows that adjustments may be made to at least some data sets that are not subsequently read using the new set of read voltage set points; for example, a new version of the data may be supplied to the SSD 110 from the host 400 that supersedes the existing data set for which the new set of read voltage set points has been derived, without the existing data set ever being subsequently read using the new read voltage set points. In this way, it would appear that the parametric adjustment effort was a wasted effort for such data sets.

However, this is not the case. It is not known at any time what read commands may be issued by the applicable host, or what write commands may be issued to supersede an existing data set. Thus, the system operates to continuously generate updated, suitable read voltage sets on a near real-time basis for all of the current data sets in the memory. It will be appreciated that these optimal sets of read voltage set points can be used immediately to accommodate any and all read commands that are actually issued.

In cases where the data sets tend to persist in the NVM for a relatively long time, as well as in cases where the NVM experiences relatively large temperature fluctuations over a relatively short interval of time, the CTMC circuit 200 can retain the optimized sets of read voltage set points for different current temperature values in the parameter memory 348.

Figure 19:
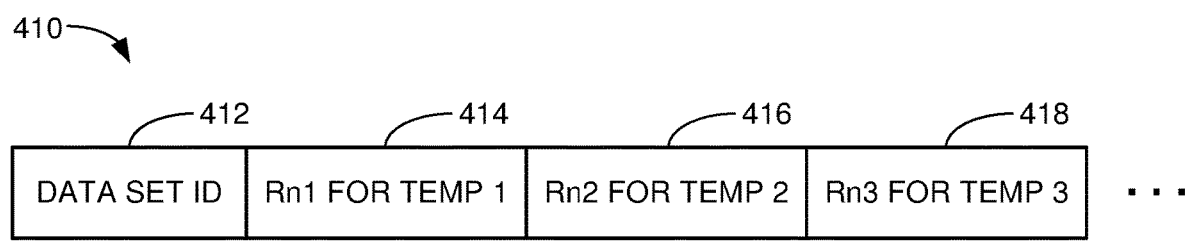
FIG. 19 shows a data structure that can be generated and utilized by the CTMC circuit in some embodiments.

This is illustrated in FIG. 19 by a data structure 410 that provides a data set identification (ID) field 412 and read voltage (Rn) fields 414, 416 and 418. The ID field 412 generally identifies an associated data set and can include location information including GCU number, page number, WL number, and so on as required to enable the system to locate the associated sets of read voltage set points in the fields 414, 416 and 418. These latter fields store the previously determined read voltage sets for different temperatures for the data set.

As a given data set is relocated from an existing location to a new location, the programming operation will take place at the current temperature. The previous read voltage set points for the existing location may be jettisoned or retained as desired as historical data associated with the existing location. This can provide longer term trend information that can be used as part of the generation of updated read voltage sets at that location.

The CTMC circuit 200 can select (or interpolate from among) the read voltage sets that are most appropriate for the current measured temperature. This can help reduce the repeated determination of read voltage set points that have already been determined for a given data set.

The skilled artisan will recognize that there will be tend to be a tradeoff between the amount of background processing required to carry out the parametric adjustments and the associated improvements in BER read performance; better read transfer rates will occur with greater frequency and complexity of the preemptive parametric adjustment operations, but at the cost of additional background processing and greater write amplification. Hence, individual owners of the various NVMe namespaces may specify different routines, thresholds, etc. that may be carried out to optimize the data transfers for the data stored in that namespace as noted above.

It is to be understood that even though numerous characteristics and advantages of various embodiments of the present disclosure have been set forth in the foregoing description, together with details of the structure and function of various embodiments of the disclosure, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising:
storing an initial temperature associated with the programming of data to a group of memory cells in a non-volatile memory (NVM);
measuring a current temperature associated with the group of NVM cells;
detecting a difference interval between the initial and current temperatures;
applying a preemptive parametric adjustment operation to the NVM responsive to the difference interval and independently of any pending read commands associated with the data, the preemptive parametric adjustment operation identifying a new set of read voltage set points for the data configured to read the data from the NVM during a subsequent read operation at the current temperature.

2. The method of claim 1, further comprising subsequently servicing a read command received from a host device to read the data from the NVM using the new set of read voltage set points obtained from the preemptive parametric adjustment operation.

3. The method of claim 1, wherein the data are characterized as a first version of the data, and wherein the method further comprises subsequently servicing a write command received from a host device to write a newer, second version of the data to a new location in the NVM prior to servicing a read command to read the first version of the data from the NVM so that the new set of read voltage set points generated from the preemptive parametric adjustment operation is not used to read the older version of the data from the NVM.

4. The method of claim 1, wherein the first temperature comprises a measured calibration temperature of the NVM associated with a first read voltage calibration operation in which a first set of read voltage set points are selected for use in reading the data from the NVM, wherein the second temperature comprises a measured current temperature of the NVM, and wherein the preemptive parametric adjustment operation comprises a second read voltage calibration operation in which the new set of read voltage set points are selected to read the data.

5. The method of claim 4, wherein the first read voltage calibration operation is characterized as a regularly scheduled read voltage calibration operation performed responsive to a timer circuit, and wherein the second read voltage calibration operation is characterized as a preemptive read voltage calibration operation performed responsive to the difference interval between the first and second temperatures.

6. The method of claim 1, wherein the first temperature comprises a measured programming temperature of the NVM at the time of the programming of the data to the group of memory cells, and the second temperature comprises a measured current temperature of the NVM.

7. The method of claim 6, wherein the preemptive parametric adjustment operation comprises a second read voltage calibration operation in which the new set of read voltage set points are selected to read the data.

8. The method of claim 6, wherein the preemptive parametric adjustment operation comprises a garbage collection operation to relocate the data from a first location to a second location in the NVM.

9. The method of claim 1, further comprising applying the preemptive parametric adjustment operation to the NVM responsive to the magnitude of the difference interval exceeding a selected threshold.

10. The method of claim 9, wherein the selected threshold is determined responsive to at least a selected one of a program/erase count, a word line address, an age of the data, a temperature at the time of programming or a total number of times that the data have been read since programmed.

11. The method of claim 1, wherein the storing step comprises storing a first flag value responsive to the initial temperature being less than a first threshold and storing a second flag value responsive to the initial temperature being greater than a second threshold, and wherein the preemptive parametric adjustment operation is carried out responsive either the current temperature being less than the first threshold and the second flag being set, or the current temperature being greater than the second threshold and the first flag being set.

12. The method of claim 1, wherein the NVM is arranged into a plurality of namespaces in accordance with the Non-Volatile Memory Express (NVMe) Standard, and wherein different preemptive parametric adjustment routines are applied to the different namespaces.

13. A data storage device, comprising:
a non-volatile memory (NVM) comprising solid-state semiconductor memory cells;
a programming circuit configured to write data to the memory cells during a programming operation;
a read circuit configured to read the data from the memory cells during a subsequent read operation; and
a cross-temperature monitor control (CTMC) circuit configured to store an initial temperature of the NVM associated with the programming of the data, to subsequently measure a current temperature data of the NVM, to detect a difference interval between the initial and current temperatures, and to apply a preemptive parametric adjustment operation to the NVM responsive to the difference interval exceeding a selected threshold and independently of any pending read commands associated with the data, the preemptive parametric adjustment operation identifying a new set of read voltage set points for the data configured to read the data from the NVM during a subsequent read operation at the current temperature.

14. The data storage device of claim 13, wherein the preemptive parametric adjustment operation comprises at least a selected one of a read voltage calibration to establish the new set of read voltage set points, a read voltage incremental adjustment to add increments to an existing set of read voltage set points to generate the new set of read voltage set points, or a garbage collection operation to relocate the data to a new location and generate the new set of read voltage set points based on the new location.

15. The data storage device of claim 13, wherein the read circuit subsequently operates to read the data using the new set of read voltage set points for the data.

16. The data storage device of claim 13, wherein the data are characterized as an older version of the data with an associated logical address, and wherein the programming circuit subsequently operates to write a newer version of the data having the associated logical address to a different location in the NVM prior to receipt of a read command so that the older version of the data are not ever read from the NVM using the new set of read voltage set points.

17. The data storage device of claim 13, wherein the first temperature comprises a measured programming temperature Tprogram of the NVM at the time of the programming of the data to the memory cells, and the second temperature comprises a measured current temperature Tcurrent of the NVM.

18. The data storage device of claim 13, wherein the first temperature comprises a measured calibration temperature Tcal of the NVM at the time of a read voltage calibration operation performed prior to the programming of the data to the memory cells, and the second temperature comprises a measured current temperature Tcurrent of the NVM.

19. The data storage device of claim 13, wherein the current temperature is generated by a temperature generation circuit responsive to a plurality of temperature samples obtained over a succession of intervals by one or more temperature sensors.

20. The data storage device of claim 13, characterized as a solid-state drive (SSD), wherein the NVM comprises flash memory.

21. A method comprising:
storing an initial temperature associated with the programming of data to a group of memory cells in a non-volatile memory (NVM);
measuring a current temperature associated with the group of NVM cells;
detecting a difference interval between the initial and current temperatures;
applying a preemptive parametric adjustment operation to the NVM responsive to the difference interval and independently of any pending read commands associated with the data, the preemptive parametric adjustment operation identifying a new set of read voltage set points for the data configured to read the data from the NVM during a subsequent read operation at the current temperature, wherein the data are characterized as a first version of the data, and wherein the method further comprises subsequently servicing a write command received from a host device to write a newer, second version of the data to a new location in the NVM prior to servicing a read command to read the first version of the data from the NVM so that the new set of read voltage set points generated from the preemptive parametric adjustment operation is not used to read the older version of the data from the NVM.

* * * * *